Oct. 27, 1964 F. N. BRAUER 3,154,752
PULSE GENERATOR EMPLOYING A RECURRENTLY-OPERABLE ONE-SHOT MULTIVIBRATOR
Filed March 1, 1961
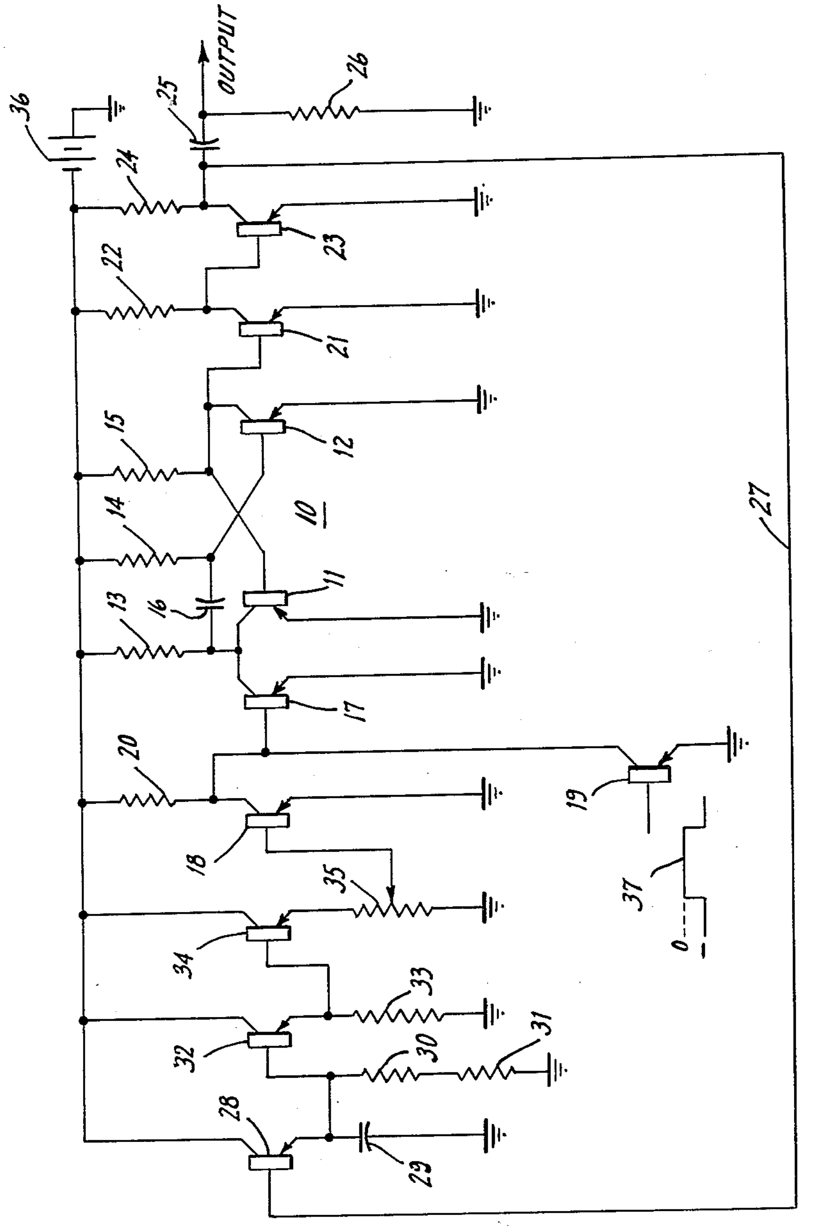
INVENTOR.
FREDERICK N. BRAUER
BY Fordyce A. Bothwell
ATTORNEY

3,154,752
PULSE GENERATOR EMPLOYING A RECURRENTLY-OPERABLE ONE-SHOT MULTIVIBRATOR

Frederick N. Brauer, Meadowbrook, Pa., assignor, by mesne assignments, to Philco Corporation, Philadelphia, Pa., a corporation of Delaware Filed Mar. 1, 1961, Ser. No. 92,603
12 Claims. (Cl. 331—113)

This invention relates to pulse generators and more particularly to the type of pulse generator whose operation is initiated and maintained in response to a control signal.

The type of pulse generator here involved produces a series of pulses in response to a control signal, the number of pulses produced in any instance being determined by the duration of the control signal and the pulse repetition rate. Such a pulse generator is useful in many instances and the need therefore has increased with the development of control systems employing digital computers.

One object of the present invention is to provide an improved pulse generator of this type which will accurately produce output pulses at a desired repetition rate for the duration of a control signal.

Another object of the invention is to provide such a pulse generator which is quick starting and highly stable in operation.

In accordance with this invention, there is provided a pulse generator wherein a one-shot multivibrator is triggered in response to a control signal and the multivibrator is caused to operate recurrently in response to its own output pulses for the duration of the control signal. Thus in the arrangement provided by this invention the one-shot multivibrator is caused to be self-triggering and recurrently operative as long as the control signal persists. Moreover the rate of recurrent operation of the multivibrator is manually adjustable to provide any desired recurrence rate of the output pulses. Thus a desired number of output pulses may be produced in response to a control signal of a given duration.

In the preferred embodiment of the invention, the recurrent operation of the one-shot multivibrator is effected through charging and discharging of a capacitor. The operation of the multivibrator is controllable by either of two parallel-connected transistors, one of which is controlled by the control signal and the other of which is controlled by the charging and discharging of said capacitor.

The invention may be fully understood from the following detailed description with reference to the accompanying drawing wherein the single figure is a diagrammatic illustration of a pulse generator according to the preferred embodiment of the invention.

Referring more particularly to the drawing, there is shown a one-shot multivibrator 10 of conventional form comprising transistors 11 and 12, resistors 13, 14 and 15, and capacitor 16, connected as shown. A triggering transistor 17 is connected in shunt with transistor 11. The triggering of the multivibrator is effected by parallel-connected transistors 18 and 19 which have a common collector resistor 20 and whose collectors are connected to the base of transistor 17. As hereinafter more fully described, initial triggering of the multivibrator in response to a control signal is effected through transistor 19, and recurrent triggering of the multivibrator is effected through operation of transistor 18.

The output pulses produced by the multivibrator may be amplified as in the two amplifier stages shown comprising transistor 21 with its collector resistor 22 and transistor 23 with its collector resistor 24. The pulses are derived at the output by way of coupling capacitor 25 and resistor 26.

The multivibrator output pulses are also supplied over connection 27 to the base of a switching transistor 28 to effect charging of a capacitor 29 connected in the emitter circuit of transistor 28. Connected across the capacitor 29 are resistors 30 and 31. The voltage across capacitor 29 is applied to the base of emitter-follower transistor 32, and the voltage across the emitter resistor 33 is applied to the base of a second emitter-follower transistor 34. A manually-variable portion of the voltage across the emitter resistor 35 is applied to the base of transistor 18.

A common supply source 36 is provided for all of the transistors.

The operation of the system is controlled according to the voltage level at the base of transistor 19. In the quiescent non-operative condition, the voltage level at the base of transistor 19 is such that this transistor is turned on, and the voltage at its collector is sufficiently positive to keep transistor 17 turned off. The multivibrator 10 is therefore in its normal quiescent state.

When a positive-going control signal such as represented at 37 is applied to the base of transistor 19, the latter is turned off and the voltage at its collector goes negative and turns on the triggering transistor 17, causing the multivibrator to produce an output pulse. The amplified pulse is supplied to the base of transistor 28 to turn it on, and the capacitor 29 immediately charges to a negative voltage. This voltage is applied through the emitter-follower stages across the potentiometer resistance 35 and is applied either in whole or in part to the base of transistor 18 to turn it on. This turns off transistor 17 and prevents re-triggering of the multivibrator until such time as the triggering transistor 17 is again turned on.

The capacitor 29 discharges, principally through resistors 30 and 31, and as the negative voltage at the base of transistor 18 decreases this transistor becomes less and less conductive until the voltage at its collector is no longer sufficiently positive to keep transistor 17 turned off. At that time transistor 17 is turned on and re-triggers the multivibrator, and the operating cycle is repeated. The cyclic operation continues for the duration of the control signal, producing a series of pulses at the output. When the control signal terminates, the voltage level at the base of transistor 19 goes negative and turns this transistor on. The system is then in its normal quiescent state, with transistor 17 held off. This condition prevails until such time as a control signal is again applied to the base of transistor 19.

From the foregoing description it will be seen that the rate of recurrence of the produced pulses is adjustable according to the setting of potentiometer 35. As the setting is lowered, the negative voltage applied to the base of transistor 18 is decreased and the re-triggering of the multivibrator is hastened. Thus the pulse recurrence rate is increased. Conversely, when the setting of potentiometer 35 is raised, the negative voltage applied to the base of transistor 18 is increased, the re-triggering of the multivibrator is delayed, and the pulse recurrence rate is decreased.

By way of example, in a physical embodiment of the system shown the parameters are as follows.

| | | |
|---|---|---|
| Resistor 13 | ohms | 2,700 |
| Resistor 14 | do | 3,300 |
| Resistor 15 | do | 1,000 |
| Capacitor 16 | micro-microfarads | 1,000 |
| Resistor 20 | ohms | 5,100 |
| Resistor 22 | do | 1,000 |
| Resistor 24 | do | 510 |
| Capacitor 25 | micro-microfarads | 100 |
| Resistor 26 | ohms | 1,000 |
| Capacitor 29 | micro-microfarads | 6,800 |
| Resistor 30 | ohms | 5,000 |
| Resistor 31 | do | 2,200 |

| | | |
|---|---|---|
| Resistor 33 | ohms | 39,000 |
| Resistor 35 | do | 1,000 |
| Battery 36 | volts | 3 |

While a preferred embodiment of the invention has been illustrated and described, it will be understood that the invention is not limited thereto but contemplates such modifications and further embodiments as may occur to those skilled in the art.

I claim:

1. A pulse generator comprising a one-shot multivibrator, means for effecting operation of said multivibrator in response to a control signal, a capacitor and discharge means therefor, means for charging said capacitor in response to an output pulse of said multivibrator, said last means including a transistor with which said capacitor is connected in series and which is turned on by an output pulse of said multivibrator to charge said capacitor, and means for effecting recurrent operation of said multivibrator in response to recurrent charging and discharging of said capacitor for the duration of said control signal.

2. A pulse generator comprising a one-shot multivibrator, a transistor which when turned on triggers said multivibrator, a pair of parallel-connected transistors having a common collector resistor, one of the latter transistors being normally on, means connecting the base of said first transistor to the collectors of said last-recited transistors, whereby said first transistor is normally off, means for turning off said normally-on transistor to turn on said first transistor and thus trigger said multivibrator, and means for effecting repeated triggering of said multivibrator in response to its own output pulse through operation of the other of said parallel-connected transistors.

3. A pulse generator comprising a one-shot multivibrator, a transistor which when turned on triggers said multivibrator, a pair of parallel-connected transistors having a common collector resistor, one of the latter transistors being normally on, means connecting the base of said first transistor to the collectors of said last-recited transistors, whereby said first transistor is normally off, means for applying a signal to said normally-on transistor to turn it off and thus turn on said first transistor to trigger said multivibrator, a capacitor and discharge means therefor, means for charging said capacitor in response to an output pulse of said multivibrator, and means for operating the other of said parallel-connected transistors in response to charging and discharging of said capacitor so as to effect repeated triggering of said multivibrator.

4. A pulse generator comprising a one-shot multivibrator, a transistor which when turned on triggers said multivibrator, a pair of parallel-connected transistors having a common collector resistor, one of the latter transistors being normally on, means connecting the base of said first transistor to the collectors of said last-recited transistors, whereby said first transistor is normally off, means for turning off said normally-on transistor to turn on said first transistor and thus trigger said multivibrator, a capacitor and discharge means therefor, means for charging said capacitor in response to an output pulse of said multivibrator, and means for applying a variable portion of the voltage across said capacitor to the base of the other of said parallel-connected transistors so as to operate the latter in response to charging and discharging of said capacitor and thus effect repeated triggering of said multivibrator.

5. A pulse generator according to claim 4, wherein said capacitor is connected in series with a transistor which is turned on by an output pulse of said multivibrator to charge said capacitor.

6. A pulse generator comprising a one-shot transistor multivibrator, a triggering transistor connected in shunt with one of the transistors of said multivibrator, a pair of parallel-connected transistors having a common collector resistor, one of the latter transistors being normally on, means connecting the base of said triggering transistor to the collectors of said parallel-connected transistors, whereby said triggering transistor is normally off, means for turning off said normally-on transistor to turn on said triggering transistor and thus trigger said multivibrator, and means for effecting repeated triggering of said multivibrator in response to its own output pulse through operation of the other of said parallel-connected transistors.

7. A pulse generator comprising a one-shot transistor multivibrator, a triggering transistor connected in shunt with one of the transistors of said multivibrator, a pair of parallel-connected transistors having a common collector resistor, one of the latter transistors being normally on, means connecting the base of said triggering transistor to the collectors of said parallel-connected transistors, whereby said triggering transistor is normally off, means for applying a signal to said normally-on transistor to turn it off and thus turn on said triggering transistor to trigger said multivibrator, and means for effecting repeated triggering of said multivibrator in response to its own output pulse through operation of the other of said parallel-connected transistors.

8. A pulse generator comprising a one-shot transistor multivibrator, a triggering transistor connected in shunt with one of the transistors of said multivibrator, a pair of parallel-connected transistors having a common collector resistor, one of the latter transistors being normally on, means connecting the base of said triggering transistor to the collectors of said parallel-connected transistors, whereby said triggering transistor is normally off, means for applying a signal to said normally-on transistor to turn it off and thus turn on said triggering transistor to trigger said multivibrator, a capacitor and discharge means therefor, means for charging said capacitor in response to an output pulse of said multivibrator, and means for operating the other of said parallel-connected transistors in response to charging and discharging of said capacitor so as to effect repeated triggering of said multivibrator.

9. A pulse generator comprising a one-shot transistor multivibrator, a triggering transistor connected in shunt with one of the transistors of said multivibrator, a pair of parallel-connected transistors having a common collector resistor, one of the latter transistors being normally on, means connecting the base of said triggering transistor to the collectors of said parallel-connected transistors, whereby said triggering transistor is normally off, means for applying a signal to said normally-on transistor to turn it off and thus turn on said triggernig transistor to trigger said multivibrator, a capacitor and discharge means therefor, means for charging said capacitor in response to an output pulse of said multivibrator, and means for applying a variable portion of the voltage across said capacitor to the base of the other of said parallel-connected transistors so as to operate the latter in response to charging and discharging of said capacitor and thus effect repeated triggering of said multivibrator.

10. A pulse generator according to claim 9, wherein said capacitor is connected in series with a transistor which is turned on by an output pulse of said multivibrator to charge said capacitor.

11. A pulse generator comprising a one-shot multivibrator, a pair of parallel-connected transistors having a common collector resistor, means connected to said multivibrator and to the collectors of said transistors for triggering said multivibrator, means for applying a control signal to one of said transistors to effect triggering of said multivibrator by said first means to produce an output pulse, and means for effecting repeated triggering of said multivibrator by said first means in response to said output pulse through operation of the other of said transistors.

12. A pulse generator comprisnig a one-shot multivibrator, a pair of parallel-connected transistors having a common collector resistor, means connected to said multivibrator and to the collectors of said transistors for triggering said multivibrator, means for applying a control signal to one of said transistors to effect triggering of said multivibrator by said first means to produce an output pulse, a capacitor and discharge means therefor, means for charging said capacitor in response to said output pulse, and means for operating the other of said transistors in response to charging and discharging of said capacitor so as to effect repeated triggering of said multivibrator by said first means.

References Cited in the file of this patent

UNITED STATES PATENTS

| | | |
|---|---|---|
| 2,851,597 | Currie | Sept. 9, 1958 |
| 2,896,081 | Machlis | July 21, 1959 |